(12) United States Patent
Lu et al.

(10) Patent No.: US 11,991,880 B2
(45) Date of Patent: May 21, 2024

(54) THREE-DIMENSIONAL MEMORY DEVICES AND FABRICATING METHODS THEREOF

(71) Applicant: Yangtze Memory Technologies Co., Ltd., Wuhan (CN)

(72) Inventors: Zhenyu Lu, Wuhan (CN); Yu Ru Huang, Wuhan (CN); Qian Tao, Wuhan (CN); Yushi Hu, Wuhan (CN); Jun Chen, Wuhan (CN); Xiaowang Dai, Wuhan (CN); Jifeng Zhu, Wuhan (CN); Yongna Li, Wuhan (CN); Lidong Song, Wuhan (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 206 days.

(21) Appl. No.: 17/015,957

(22) Filed: Sep. 9, 2020

(65) Prior Publication Data

US 2020/0411547 A1 Dec. 31, 2020

Related U.S. Application Data

(60) Division of application No. 16/126,416, filed on Sep. 10, 2018, now Pat. No. 10,804,287, which is a
(Continued)

(30) Foreign Application Priority Data

Aug. 28, 2017 (CN) .......................... 201710751281.8

(51) Int. Cl.
*H10B 43/27* (2023.01)
*H01L 21/033* (2006.01)
(Continued)

(52) U.S. Cl.
CPC ......... *H10B 43/27* (2023.02); *H01L 21/0337* (2013.01); *H01L 29/40117* (2019.08);
(Continued)

(58) Field of Classification Search
CPC ........... H01L 27/1157; H01L 21/11582; H10B 43/27; H10B 43/35
See application file for complete search history.

(56) References Cited

U.S. PATENT DOCUMENTS 8,148,769 B2 4/2012 Kito et al.
8,878,278 B2 11/2014 Alsmeier et al.
(Continued)

FOREIGN PATENT DOCUMENTS

CN 104205342 A 12/2014
CN 104956485 A 9/2015
(Continued)

OTHER PUBLICATIONS

International Search Report and Writtern Opinion of the International Searching Authority directed to related International Patent Application No. PCT/CN2018/096156, dated Oct. 19, 2018; 9 pages.

*Primary Examiner* — Alia Sabur
(74) *Attorney, Agent, or Firm* — Sterne, Kessler, Goldstein & Fox P.L.L.C.

(57) ABSTRACT

A method for forming a 3D memory device is disclosed. The method includes: forming an alternating dielectric stack on a substrate; forming a plurality of channel holes penetrating the alternating dielectric stack; forming a channel structure in each channel hole; forming a channel column structure on the channel structure in each channel hole; trimming an upper portion of each channel column structure to form a channel plug; and forming a top selective gate cut between neighboring channel plugs.

9 Claims, 15 Drawing Sheets

Related U.S. Application Data continuation of application No. PCT/CN2018/096156, filed on Jul. 18, 2018.

(51) Int. Cl.
  *H01L 21/28* (2006.01)
  *H01L 23/532* (2006.01)
  *H10B 43/10* (2023.01)
  *H10B 43/35* (2023.01)

(52) U.S. Cl.
  CPC ............ *H10B 43/10* (2023.02); *H10B 43/35* (2023.02); *H01L 23/53295* (2013.01)

(56) References Cited

U.S. PATENT DOCUMENTS

| | | | |
|---|---|---|---|
| 9,219,070 B2 | 12/2015 | Thimmegowda et al. | |
| 9,349,745 B2 | 5/2016 | Lue | |
| 2010/0276743 A1* | 11/2010 | Kuniya | H01L 29/66833 257/315 |
| 2011/0051527 A1* | 3/2011 | Kirisawa | H10B 43/27 365/185.29 |
| 2011/0063914 A1* | 3/2011 | Mikajiri | G11C 5/02 365/185.15 |
| 2012/0098049 A1* | 4/2012 | Moon | H10B 43/27 257/324 |
| 2012/0168824 A1* | 7/2012 | Lee | H10B 43/10 257/E21.41 |
| 2012/0299086 A1* | 11/2012 | Lee | G11C 16/0408 257/324 |
| 2013/0248974 A1* | 9/2013 | Alsmeier | G11C 16/04 438/264 |
| 2014/0003148 A1 | 1/2014 | Sun et al. | |
| 2014/0264549 A1* | 9/2014 | Lee | H01L 29/66833 438/269 |
| 2014/0284697 A1* | 9/2014 | Wang | H10B 41/27 257/324 |
| 2015/0001460 A1* | 1/2015 | Kim | H10B 43/20 257/5 |
| 2015/0255486 A1* | 9/2015 | Kameoka | H10B 41/35 257/314 |
| 2015/0303213 A1 | 10/2015 | Sim et al. | |
| 2015/0364483 A1 | 12/2015 | Koval | |
| 2015/0364487 A1* | 12/2015 | Yun | H10B 43/35 257/324 |
| 2017/0077108 A1* | 3/2017 | Kawaguchi | H01L 27/11565 |
| 2017/0103998 A1 | 4/2017 | Chang et al. | |
| 2017/0133397 A1 | 5/2017 | Lee | |
| 2017/0186755 A1* | 6/2017 | Lai | H01L 28/00 |
| 2017/0236896 A1* | 8/2017 | Lu | H10B 41/27 257/314 |
| 2018/0277555 A1* | 9/2018 | Fukushima | H01L 23/5329 |
| 2019/0013327 A1 | 1/2019 | He et al. | |
| 2019/0074291 A1 | 3/2019 | Lu et al. | |

FOREIGN PATENT DOCUMENTS

| | | |
|---|---|---|
| CN | 105448928 A | 3/2016 |
| CN | 105870068 A | 8/2016 |
| CN | 106469730 A | 3/2017 |
| CN | 106847821 A | 6/2017 |
| CN | 106920799 A | 7/2017 |
| CN | 107482013 A | 12/2017 |
| TW | 201017830 A | 5/2010 |
| TW | 201717360 A | 5/2017 |
| TW | I587488 B | 6/2017 |
| TW | 201724367 A | 7/2017 |
| WO | WO 2019/042037 A1 | 3/2019 |

* cited by examiner

THREE-DIMENSIONAL MEMORY DEVICES AND FABRICATING METHODS THEREOF

CROSS-REFERENCE TO RELATED APPLICATIONS

This application is a divisional application of U.S. patent application Ser. No. 16/126,416, filed on Sep. 10, 2018, which claims priority to PCT/CN2018/096156 filed on Jul. 18, 2018, which claims priority to Chinese Patent Application No. 201710751281.8, filed on Aug. 28, 2017, the entire contents of which are incorporated herein by reference.

TECHNICAL FIELD

The present disclosure generally relates to the field of semiconductor technology, and more particularly, to a method for forming a three-dimensional (3D) memory device.

BACKGROUND

Planar memory cells are scaled to smaller sizes by improving process technology, circuit design, programming algorithm, and fabrication process. However, as feature sizes of the memory cells approach a lower limit, planar process and fabrication techniques become challenging and costly. As such, memory density for planar memory cells approaches an upper limit. A three-dimensional (3D) memory architecture can address the density limitation in planar memory cells.

As semiconductor technology advances, 3D memory devices, such as 3D NAND memory devices, keep scaling more oxide/nitride (ON) layers to improve the area utilization of wafers. In some existing 3D NAND memory devices, a memory finger includes nine rows of channel holes arranged in a staggered manner, which requires a large wafer. It is a challenge to reduce the size of the wafer without changing the storage capacity, and thereby reducing the size of the 3D NAND memory devices.

BRIEF SUMMARY

Embodiments of a method for forming a three-dimensional (3D) memory devices are disclosed herein.

The method for forming a three-dimensional (3D) memory device can comprises: forming an alternating dielectric stack on a substrate; forming a plurality of channel holes penetrating the alternating dielectric stack; forming a channel structure in each channel hole; forming a channel column structure on the channel structure in each channel hole; trimming an upper portion of each channel column structure to form a channel plug; and forming a top selective gate cut between neighboring channel plugs.

In some embodiments, forming the alternating dielectric stack comprises: forming at least 32 dielectric layer pairs stacked in a vertical direction, wherein each dielectric layer pair includes a first dielectric layer and a second dielectric layer that is different from the first dielectric layer.

In some embodiments, forming the alternating dielectric stack comprises: forming at least 32 dielectric layer pairs stacked in a vertical direction, wherein each dielectric layer pair includes a silicon oxide layer and a silicon nitride layer.

In some embodiments, the method further comprises: forming a first insulating layer on the alternating dielectric stack as the first insulating layer; and forming a hard mask layer on the first insulating layer. The plurality of channel holes can penetrate the first insulating layer and the hard mask layer.

In some embodiments, the method further comprises: before forming the channel structure, forming an epitaxial layer on a surface of the substrate that is exposed by the channel hole.

In some embodiments, forming the channel structure comprises: forming a functional layer on a sidewall of the channel hole; forming a channel layer covering a sidewall of the functional layer, the channel layer being in contact with the epitaxial layer; and forming a filling structure covering a sidewall of the channel layer and filling the channel hole.

In some embodiments, forming the functional layer comprises: forming a barrier layer on the sidewall of the first channel hole to block an outflow of electronic charges; forming a storage layer on a surface of the first barrier layer to store electronic charges during operation of the 3D memory device; and forming a tunneling layer on a surface of the first storage layer to tunnel electronic charges.

In some embodiments, forming the channel column structure comprises: forming a recess in the channel structure to expose an upper portion of the channel layer; forming a channel column structure in the recess; and planarizing a top surface of the channel column structure.

In some embodiments, forming the channel plug comprises: removing the hard mask layer to expose an upper portion of a sidewall of the channel column structure; and trimming the sidewall of the channel column structure to reduce a diameter of the upper portion of the channel column structure in a lateral direction to form the channel plug.

In some embodiments, the method further comprises: after forming the channel plugs, forming a top selective gate structure on the first insulating layer.

In some embodiments, forming the top selective gate structure comprises: forming a second insulating layer to cover exposed surfaces of the channel column structure and the channel plug; forming a gate electrode layer on the first insulating layer and the second insulating layer; removing an upper portion of the gate electrode layer to expose a top surface of the second insulating layer, the remaining portion of the gate electrode layer forming the top selective gate structure; and forming a third insulating layer to cover the top selective gate structure.

In some embodiments, forming the top selective gate cut comprises: forming a trench between neighboring channel plugs, the trench penetrating the third insulating layer and the top selective gate structure to expose the first insulating layer; and depositing a dielectric material in the trench to form the top selective gate cut.

In some embodiments, forming the top selective gate cut comprises: forming the top selective gate cut that has a wavy shape extending along a lateral direction.

In some embodiments, the method further comprises: forming a pair of slits penetrating the alternating dielectric stack, the pair of slits being extended in parallel along the lateral direction; forming a number N of rows of channel holes between the pair of slits, wherein each row of channel holes are arranged staggered with adjacent row of channel holes, and N is an even number; and forming the top selective gate cut between number N/2 row of channel holes and number N/2+1 row of channel holes.

In some embodiments, the method further comprises: forming eight rows of channel holes between the pair of slits; and forming the top selective gate cut between the fourth rows of channel holes and the fifth rows of channel holes.

In some embodiments, the method further comprises: forming the channel plug that has a diameter of a top surface within a range between 50 nm to 150 nm; and forming the top selective gate cut that has a width of a top surface within a range between 10 nm to 110 nm. A minimum distance between the top selective gate cut and an adjacent channel plug is within a range between 10 nm to 60 nm.

In some embodiments, the method further comprises: replacing the second dielectric layers in the alternating dielectric with conductive layers.

Another aspect of the present disclosure provides a three-dimensional (3D) memory device, comprising: an alternating layer stack on a substrate; a plurality of channel holes penetrating the alternating layer stack; a channel structure in each channel hole; a channel column structure on the channel structure in each channel hole, wherein an upper portion of a channel column structure has a first diameter that is less than a second diameter of a lower portion of the channel column structure; and a top selective gate cut between neighboring channel column structure.

In some embodiments, the alternating layer stack comprises: at least 32 conductive/dielectric layer pairs stacked in a vertical direction, wherein each conductive/dielectric pair includes a dielectric layer and a conductive layer.

In some embodiments, the alternating layer stack comprises: at least 32 conductive/dielectric layer pairs stacked in a vertical direction, wherein each conductive/dielectric layer pair includes a silicon oxide layer and a tungsten layer.

In some embodiments, the 3D memory device further comprises: a first insulating layer on the alternating dielectric stack as the first insulating layer. The plurality of channel holes penetrate the first insulating layer and the hard mask layer.

In some embodiments, the channel structure comprises: an epitaxial layer on a bottom of the channel hole; a functional layer on a sidewall of the channel hole; a channel layer covering a sidewall of the functional layer, the channel layer being in contact with the epitaxial layer; and a filling structure covering a sidewall of the channel layer and filling the channel hole.

In some embodiments, the functional layer comprises: a barrier layer on the sidewall of the first channel hole configured to block an outflow of electronic charges; a storage layer on a surface of the first barrier layer configured to store electronic charges during operation of the 3D memory device; and a tunneling layer on a surface of the first storage layer configured to tunnel electronic charges.

In some embodiments, the 3D memory device further comprises: a top selective gate structure on the first insulating layer; a second insulating layer between the top selective gate structure and the channel column structure; and a third insulating layer on a top surface of the top selective gate structure.

In some embodiments, the top selective gate cut penetrates the third insulating layer and the top selective gate structure.

In some embodiments, the top selective gate cut has a wavy shape extending along a lateral direction.

In some embodiments, the 3D memory device further comprises: a pair of slits penetrating the alternating dielectric stack, the pair of slits being extended in parallel along the lateral direction. A number N of rows of channel holes are located between the pair of slits, and N is an even number. Each row of channel holes are arranged staggered with adjacent row of channel holes. The top selective gate cut is located between number N/2 row of channel holes and number N/2+1 row of channel holes.

In some embodiments, the number N is eight.

In some embodiments, a diameter of a top surface of the channel plug is within a range between 50 nm to 150 nm. A width of a top surface of the top selective gate cut is within a range between 10 nm to 110 nm. A minimum distance between the top selective gate cut and an adjacent channel plug is within a range between 10 nm to 60 nm.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
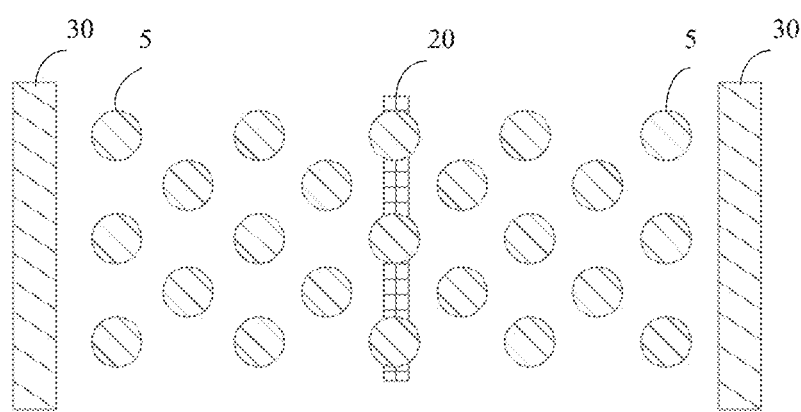
FIG. 1 illustrates a top view of an exemplary 3D memory device.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnection layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically-oriented strings of memory cell transistors (i.e., region herein as "memory strings," such as NAND strings) on a laterally-oriented substrate so that the memory strings extend in the vertical direction with respect to the substrate. As used herein, the term "vertical/vertically" means nominally perpendicular to a lateral surface of a substrate.

Various embodiments in accordance with the present disclosure provide a method for forming a 3D memory device with a top selective gate cut structure for a memory array (also referred to herein as an "array device"). By trimming an upper portion of channel column structures, the formed channel plugs can have a reduced size the in a lateral direction. That is, the spacing between two adjacent channel plugs can be increased. As such, without occupying the location of a row of channel holes, the top selective gate cut can be arranged between adjacent channel plugs. By reducing a number of channel holes in each memory finger, an area of each memory finger can be reduced. Therefore, the size requirement of the wafer can be decreased without lowing the storage capacity, which thereby results in a reduced size of the 3D NAND memory device, and a reduced cost.

Referring to FIG. 1, a schematic diagram of a 3D memory device is shown in a top view. As shown, in some existing 3D NAND memory devices, multiple slits 30 can be extended in parallel along a lateral direction to divide the memory array into multiple memory fingers. Each memory finger can include nine rows of channel holes 5 arranged in a staggered manner between two adjacent slits 30. A top selective gate (TSG) cut 20 is located in the middle of the memory finger to separate the memory finger into two equal parts. Due to the size limitation, the top selective gate cut 20 occupies the locations of the fifth row of the nine rows of channel holes 5.

Figure 2:
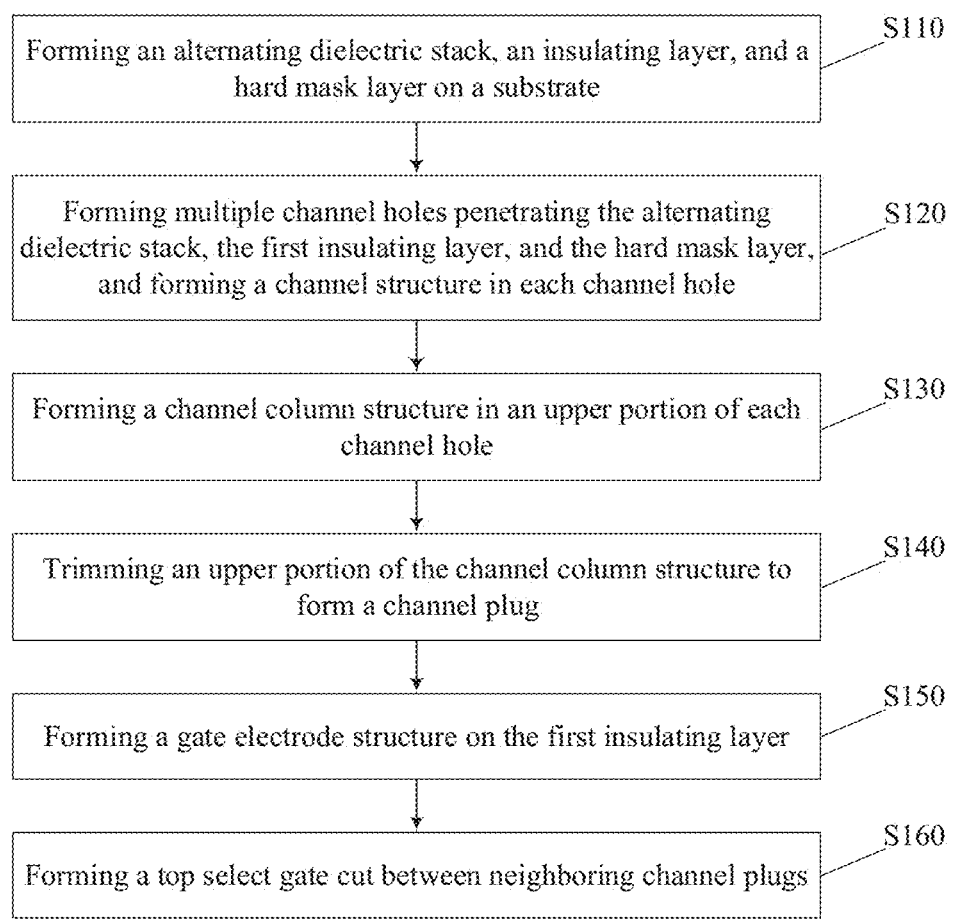
FIG. 2 illustrates a flow diagram of an exemplary method for forming a 3D memory device in accordance with some embodiments of the present disclosure.

Referring to FIG. 2, a flow diagram of an exemplary method for forming a 3D memory device is shown in accordance with some embodiments of the present disclosure. FIGS. 3-14 illustrate cross-sectional views of an exemplary 3D memory device at certain fabricating stages of the method shown in FIG. 2.

As shown in FIG. 2, the method can start at operation S110, in which an alternating dielectric stack, a first insulating layer, and a hard mask layer can be formed on a substrate.

Figure 3:
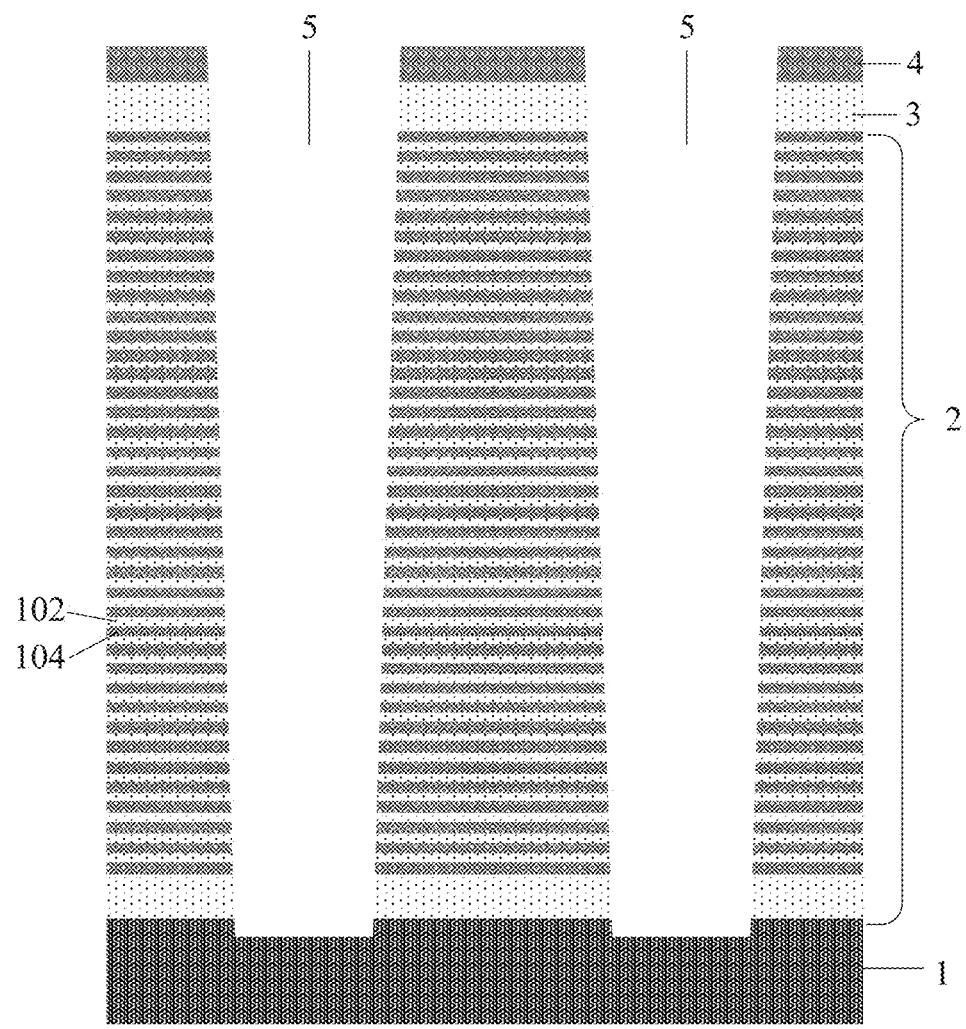
FIGS. 3-14 illustrate cross-sectional views of an exemplary 3D memory device at certain fabricating stages of the method shown in FIG. 2.

As shown in FIG. 3, in some embodiments, the substrate 1 can be any suitable semiconductor substrate having any suitable structure, such as a monocrystalline single-layer substrate, a polycrystalline silicon (polysilicon) single-layer substrate, a polysilicon and metal multi-layer substrate, etc.

The alternating dielectric stack 2 including a plurality of dielectric layer pairs can be formed on the substrate 1. The alternating dielectric stack 2 can include an alternating stack of a first dielectric layer 102 (e.g., silicon oxide) and a second dielectric layer 104 (e.g., silicon nitride) that is different from first dielectric layer, for example. The plurality of first dielectric layers 102 and second dielectric layers 104 are extended in a lateral direction that is parallel to the surface of the substrate 1. In some embodiments, there are more layers than the dielectric layer pairs made of different materials and with different thicknesses in the alternating dielectric stack 2. The alternating dielectric stack 2 can be formed by one or more thin film deposition processes including, but not limited to, Chemical Vapor Deposition (CVD), Physical Vapor Deposition (PVD), Atomic Layer Deposition (ALD), or any combination thereof.

In some embodiments, the alternating dielectric stack 2 can include a plurality of Silicon oxide/nitride layer pairs. Each dielectric layer pair includes a layer of silicon oxide 102 and a layer of silicon nitride 104. The plurality of oxide/nitride layer pairs are also referred to herein as an "alternating oxide/nitride stack." That is, in the alternating dielectric stack 2, multiple oxide layers 102 (shown in the areas with dotes) and multiple nitride layers 104 (shown in the areas with meshes) alternate in a vertical direction. In other words, except a top and a bottom layer of a given alternating oxide/nitride stack, each of the other oxide layers 102 can be sandwiched by two adjacent nitride layers 104, and each of the nitride layers 104 can be sandwiched by two adjacent oxide layers 102.

Oxide layers can each have the same thickness or have different thicknesses. For example, a thickness of each oxide layer can be in a range from 10 nm to 100 nm, preferably about 25 nm. Similarly, nitride layers can each have the same thickness or have different thicknesses. For example, a thickness of each nitride layer can be in a range from 10 nm to 100 nm, preferably about 35 nm.

It is noted that, in the present disclosure, the oxide layers 102 and/or nitride layers 104 can include any suitable oxide materials and/or nitride materials. For example, the oxide materials can include silicides, and the element of nitride materials can include, but not limited to, tungsten (W), cobalt (Co), copper (Cu), aluminum (Al), doped silicon, silicides, or any combination thereof. In some embodiments, the oxide layers can be silicon oxide layers, and the nitride layers can be silicon nitride layer.

The alternating dielectric stack 2 can include any suitable number of layers of the oxide layers 102 and the nitride layers 104. In some embodiments, a total number of layers of the oxide layers 102 and the nitride layers 104 in the alternating dielectric stack 2 is equal to or larger than 64. That is, a number of oxide/nitride layer pairs can be equal to or larger than 32. In some embodiments, the alternating oxide/nitride stack 2 includes more oxide layers or more nitride layers with different materials and/or thicknesses than the oxide/nitride layer pair.

The first insulating layer 3 can be formed on the alternating dielectric stack 2. In some embodiments, the first insulating layer 3 can be made by any suitable insulating material and/or dielectric material, such as silicon oxide. It is noted that, the material of the first insulating layer 3 can be different from the material of the nitride layer in the alternating dielectric stack 2. The first insulating layer 3 can be formed on the top surface of the alternating dielectric stack 2. The hard mask layer 4 can be a nitride layer formed on the top surface of the first insulating layer 3. For example, the hard mask layer 4 can be a silicon nitride layer.

In some embodiments, the alternating dielectric stack 2, the first insulating layer 3, and/or the hard mask layer 4 can be formed by using one or more deposition processes. It is noted that, the term "deposition process" used in the present disclosure can be referred to any suitable deposition process including, but not limited to, a chemical vapor deposition (CVD) process, a physical vapor deposition (PVD) process, an atomic layer deposition (ALD) process, and/or any suitable combination thereof.

Referring back to FIG. 2, in a next operation S120, multiple channel holes 5 can be formed to penetrate the alternating dielectric stack 2, the first insulating layer 3, and the hard mask layer 4, and a channel structure can be formed in each channel hole 5.

In some embodiments, multiple channel holes 5 can be form and arranged in a staggered array form. For example, as shown in the top view in FIG. 1, each row of channel holes 5 can be staggered with its neighboring rows of channel holes 110. As shown in the sectional view in FIG. 3, each channel hole 5 can completely penetrate the alternating dielectric stack 2 and the first insulating layer 3, and can extend into the substrate 1. In some embodiments, the channel hole 5 can be formed by etching the alternating dielectric stack 2, the first insulating layer 3, the hard mask layer 4, and a subsequent cleaning process. The etching process to form the channel hole 5 can be a dry etching, or a combination of a wet etching and a following cleaning process.

In some embodiments, a channel structure can be formed in each channel hole 5. The channel structure can include an epitaxial layer 6 on the bottom of the channel hole 5, a functional layer 10 on the sidewall of the channel hole 5, and a filling structure 12 in the channel hole 5, and a channel layer 11 between the functional layer 10 and the dielectric filling structure 12. The functional layer 10 can include a barrier layer 7, a storage layer 8, and a tunneling layer 9.

Figure 4:
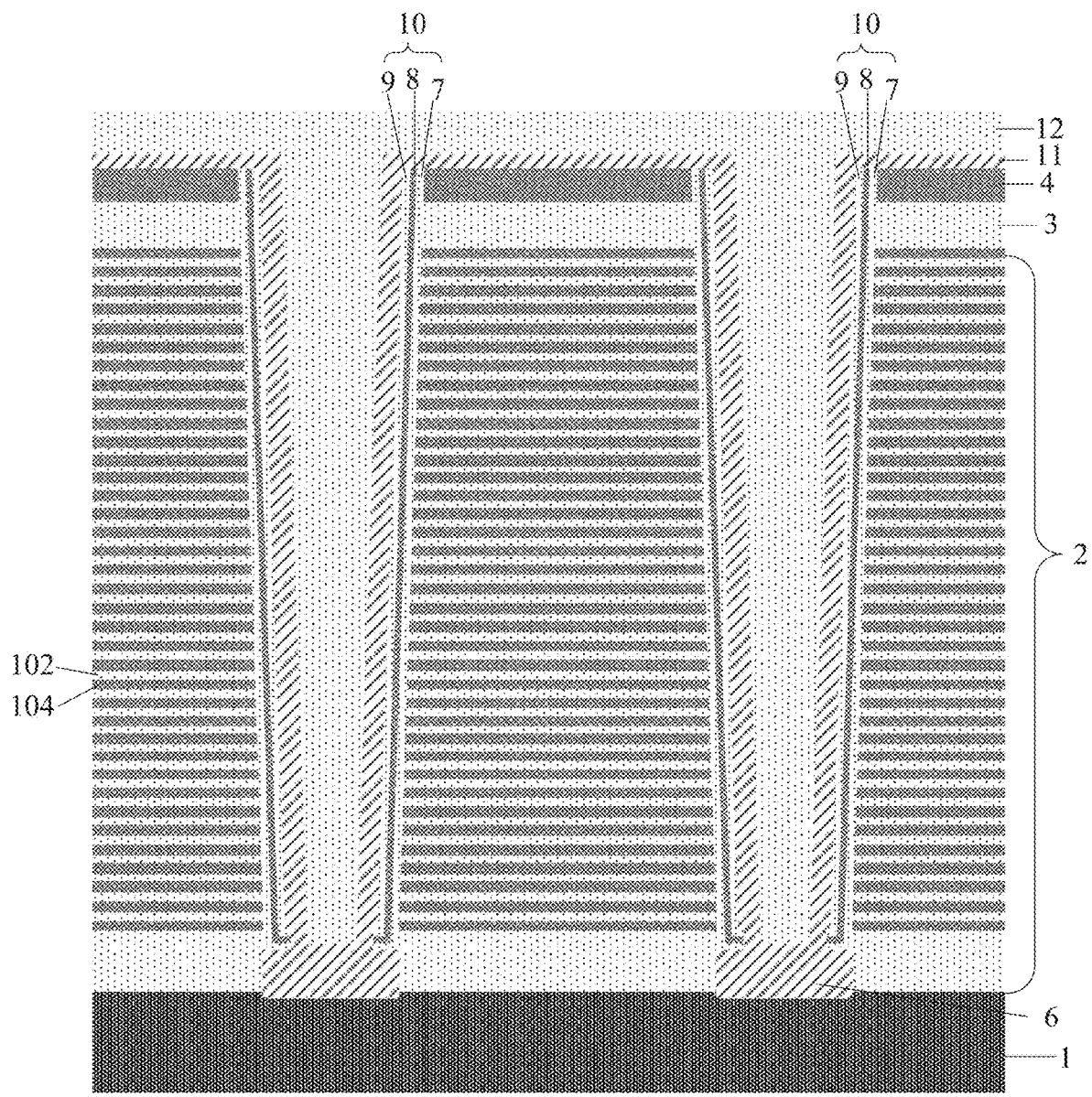

As shown in FIG. 4, the epitaxial layer 6 can be formed on the bottom of the channel hole 5 and on the substrate 1 that is exposed by the channel hole 5. In some embodiments, the epitaxial layer 6 can be a polycrystalline silicon (polysilicon) layer formed by a selective epitaxial growth (SEG) process. In some embodiments, the epitaxial layer 6 may not be directly formed on the surface of the substrate 1. One or more layers can be formed between the epitaxial layer 6 and the substrate 1. That is, the epitaxial layer 6 overlays the substrate 1.

The functional layer 10 can include a barrier layer 7, a storage layer 8, and a tunneling layer 9, and can be formed on the sidewall of the channel hole 5. The barrier layer 7 can be used for blocking the outflow of the electronic charges. In some embodiments, the barrier layer 7 can be a silicon oxide layer or a combination of silicon oxide/silicon oxynitride/silicon oxide ($SiO_2$—$SiON$—$SiO_2$) multi-layer stack. In some embodiments, the barrier layer 7 includes high dielectric constant (high-k) dielectrics (e.g., aluminum oxide). In one example, the barrier layer 7 is mainly an oxide layer formed by In-Situ Steam Generation (ISSG) oxidation after a silicon nitride deposition process. In some embodiments, a thickness of the barrier layer 7 can be less than 20 nm.

The storage layer 8 can be used for storing electronic charges. The storage and/or removal of charges in the storage layer 8 can impact the on/off state and/or a conductance of the semiconductor channel. The storage layer 8 can include polycrystalline silicon (polysilicon) or silicon nitride. The storage layer 8 can include one or more films of materials including, but are not limited to, silicon nitride, silicon oxynitride, a combination of silicon oxide and silicon nitride, or any combination thereof. In some embodiments, the first storage layer 8 can include a nitride layer formed by using one or more deposition processes.

The tunneling layer 9 can be used for tunneling electronic charges (electrons or holes). The tunneling layer 9 can be dielectric materials including, but not limited to, silicon oxide, silicon nitride, silicon oxynitride, or any combination thereof. In some embodiments, the tunneling layer 9 can be an oxide layer formed by using a deposition process. In some embodiments, a thickness of the tunneling layer 9 can be less than 20 nm.

As shown in FIG. 4, the channel layer 11 can be formed to cover the functional layer 10, the exposed surface of the epitaxial layer, and the hard mask layer 4. In some embodiments, the channel layer 11 can be an amorphous silicon layer or a polysilicon layer formed by using a thin film deposition process, such as a low pressure chemical vapor deposition (LPCVD) process; plasma enhanced chemical vapor deposition (PECVD) process, Atomic Layer Deposition (ALD) or any other suitable processes. In some embodiments, a thickness of the channel layer 11 can be less than about 20 nm.

The dielectric filling structure 12 can be formed to cover the channel layer 11 and fill the channel hole 5. In some embodiments, the filling structure 12 can be an oxide layer formed by using a deposition process, such as an atomic layer deposition (ALD) process. In some embodiments, the filling structure 12 can include one or more airgaps (not shown).

Referring back to FIG. 2, in a next operation S130, a channel column structure 15 can be formed in an upper portion of each channel hole 5.

Figure 5:
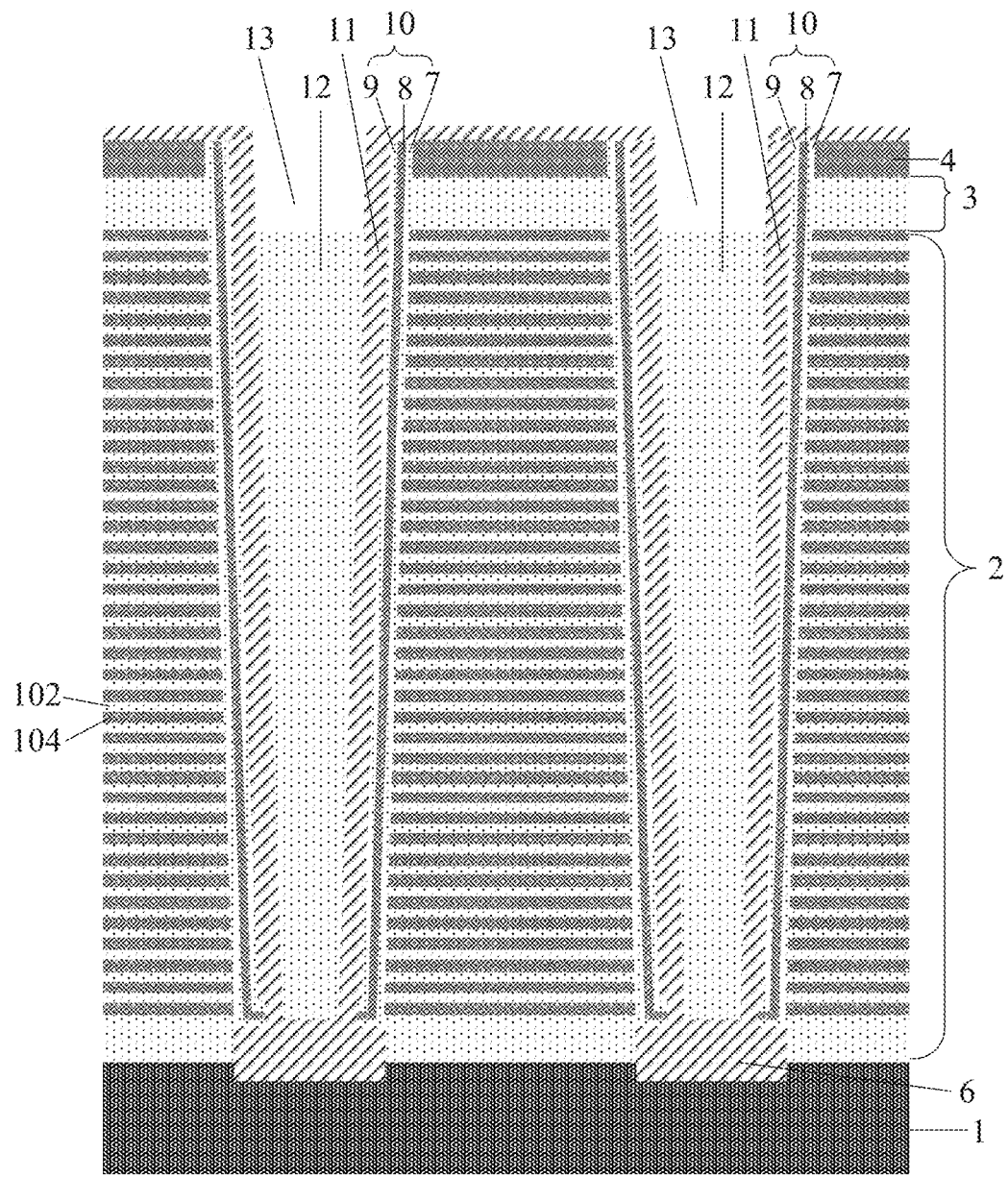

As shown in FIG. 5, an upper portion of the filling structure 12 can be removed (which is normally called "etch back"), so that the top surface of the remaining portion of the filling structure 12 is lower than the top surface of the first insulating layer 3 but not lower than the bottom surface of the first insulating layer 3 for better device performance. In some embodiments, the upper portion of the filling structure 12 can be removed by using a recess etching process including, but not limited to, a wet etching, a dry etching, or a combination thereof. For example, a non-selective dry etching process can be performed to remove the upper portion of the filling structure 12. As such, a recess 13 can be formed in the channel hole 5 and above the remaining portion of the filling structure 12. A following diluted hydrofluoric acid (HF) cleaning process can be performed to clean the sidewall and bottom of the recess 13.

Figure 6:
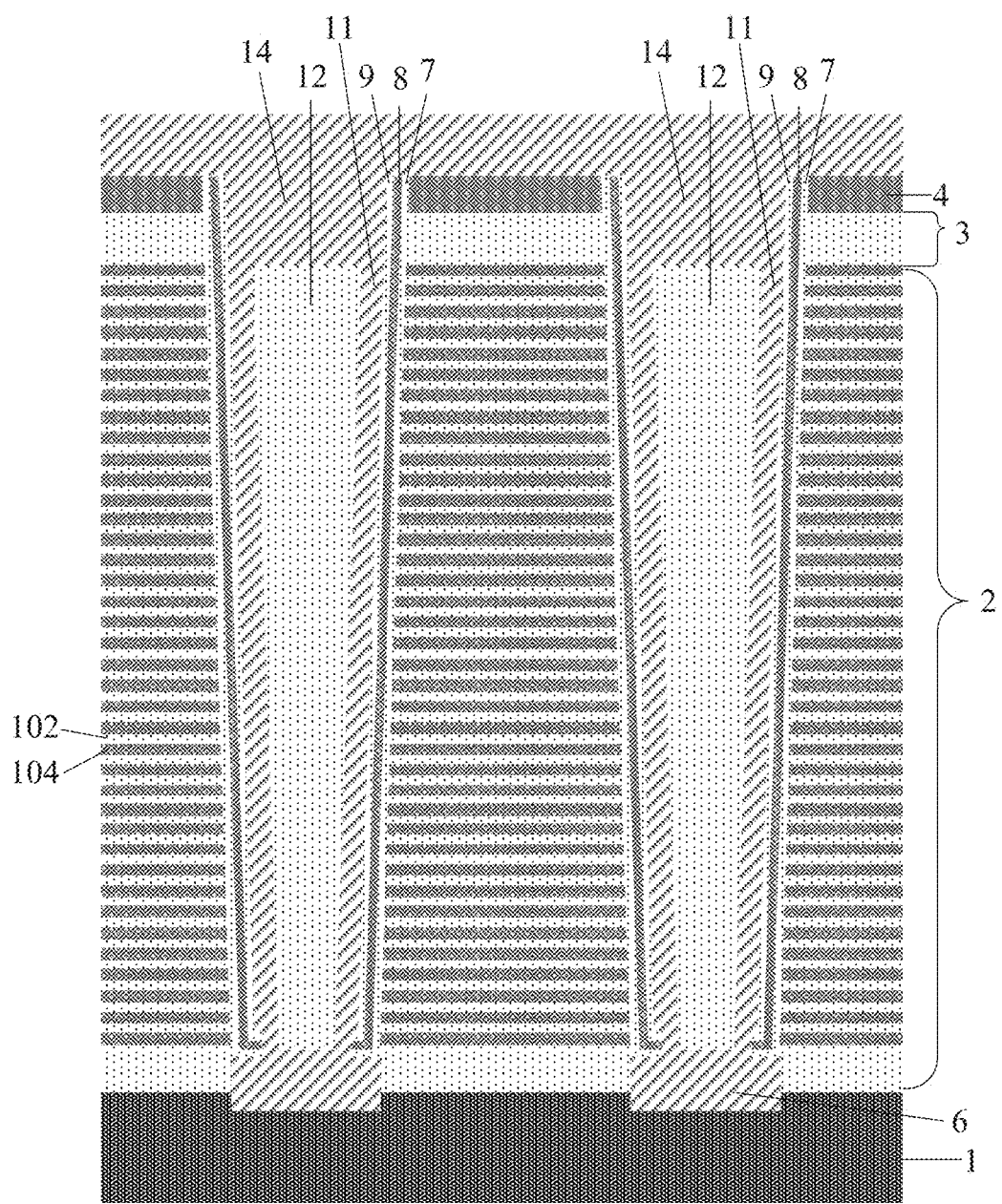

As shown in FIG. 6, a top channel layer 14 can be formed to cover the hard mask layer 4 and to fill the recess 13 that is on the filling structure 12. The top channel layer 14 can be an amorphous silicon layer or a polysilicon layer formed by using a thin film deposition process, such as a low pressure chemical vapor deposition (LPCVD) process; plasma enhanced chemical vapor deposition (PECVD) process, Atomic Layer Deposition (ALD) or any other suitable processes. The top channel layer 14 is in contact with the channel layer 11.

Figure 7:
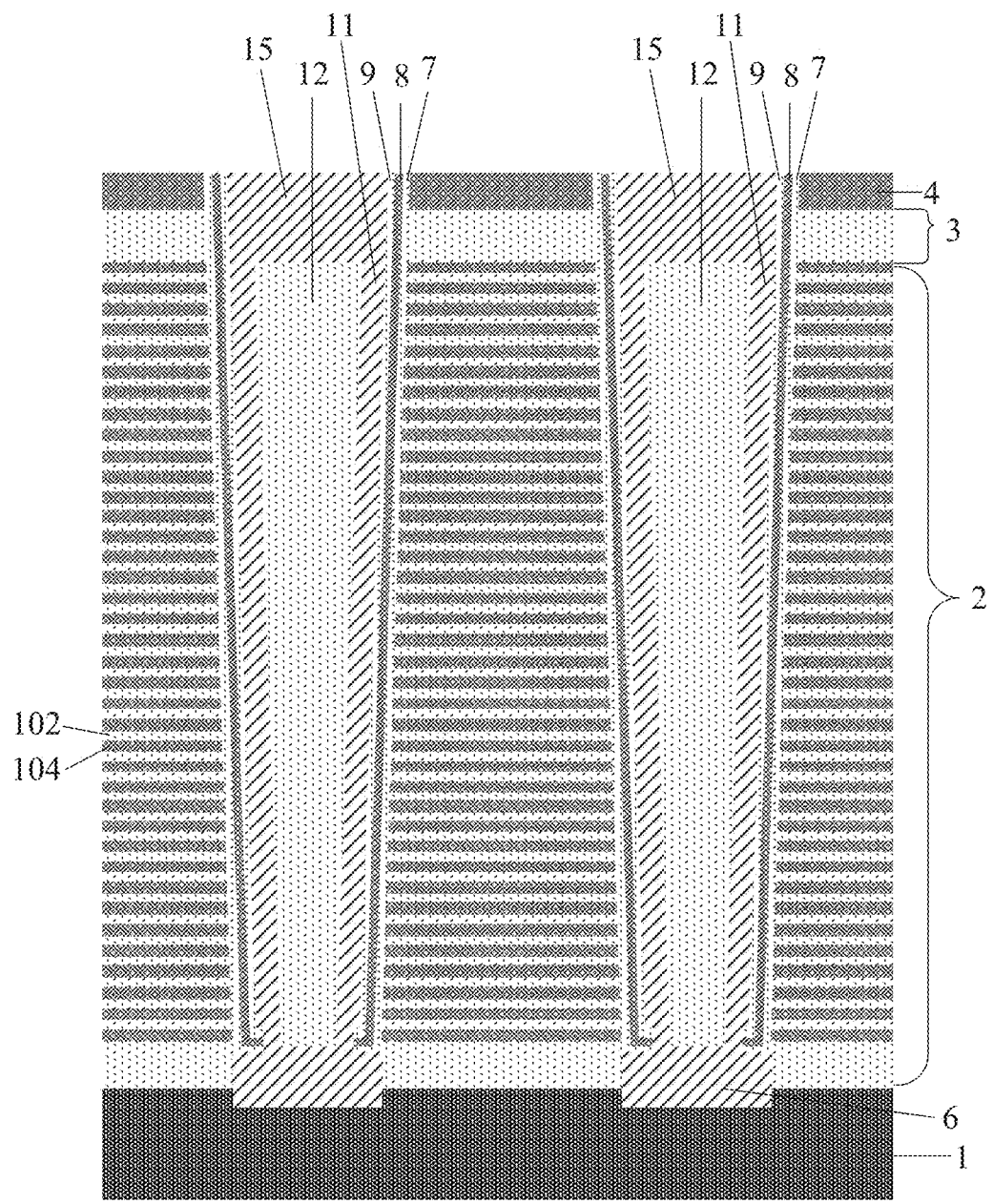

As shown in FIG. 7, the top surface of the top channel layer 14 can be planarized by any suitable techniques, such as backside grinding, and/or chemical mechanical polishing (CMP). As such, an upper portion of the top channel layer 14 outside the channel hole 5 can be removed, and the remaining portion of the top channel layer 14 inside the channel hole 5 can form the channel column structure 15. The top surface of the channel column structure 15 can be in level with the top surface of the hard mask layer 4. A thickness of the channel column structure 15 in the vertical direction can be in a range between 30 nm and 100 nm, and a diameter of the channel column structure 15 in the lateral direction can be equal to the diameter of the channel hole 5.

Figure 8:
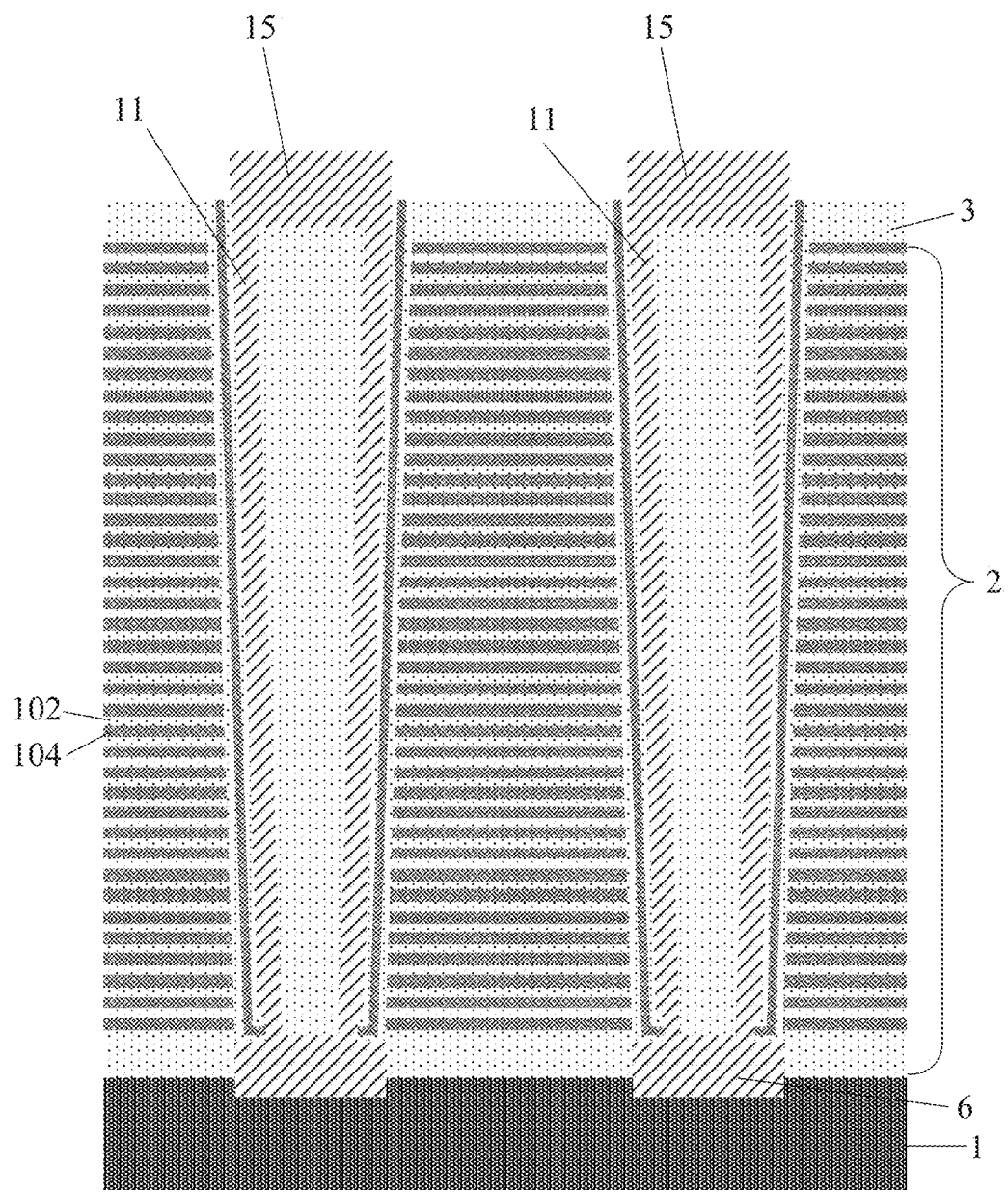

Referring back to FIG. 2, in a next operation S140, an upper portion of the channel column structure 15 can be trimmed to form a channel plug 16. As shown in FIG. 8, the hard mask layer 4 can be removed by using any suitable etching processes, such as a wet etching, a dry etching, or a combination thereof. In some embodiments, an upper portion of the first insulating layer 3 can also be etched. Thus, an upper portion of each channel column structure 15 can be exposed.

Figure 9:
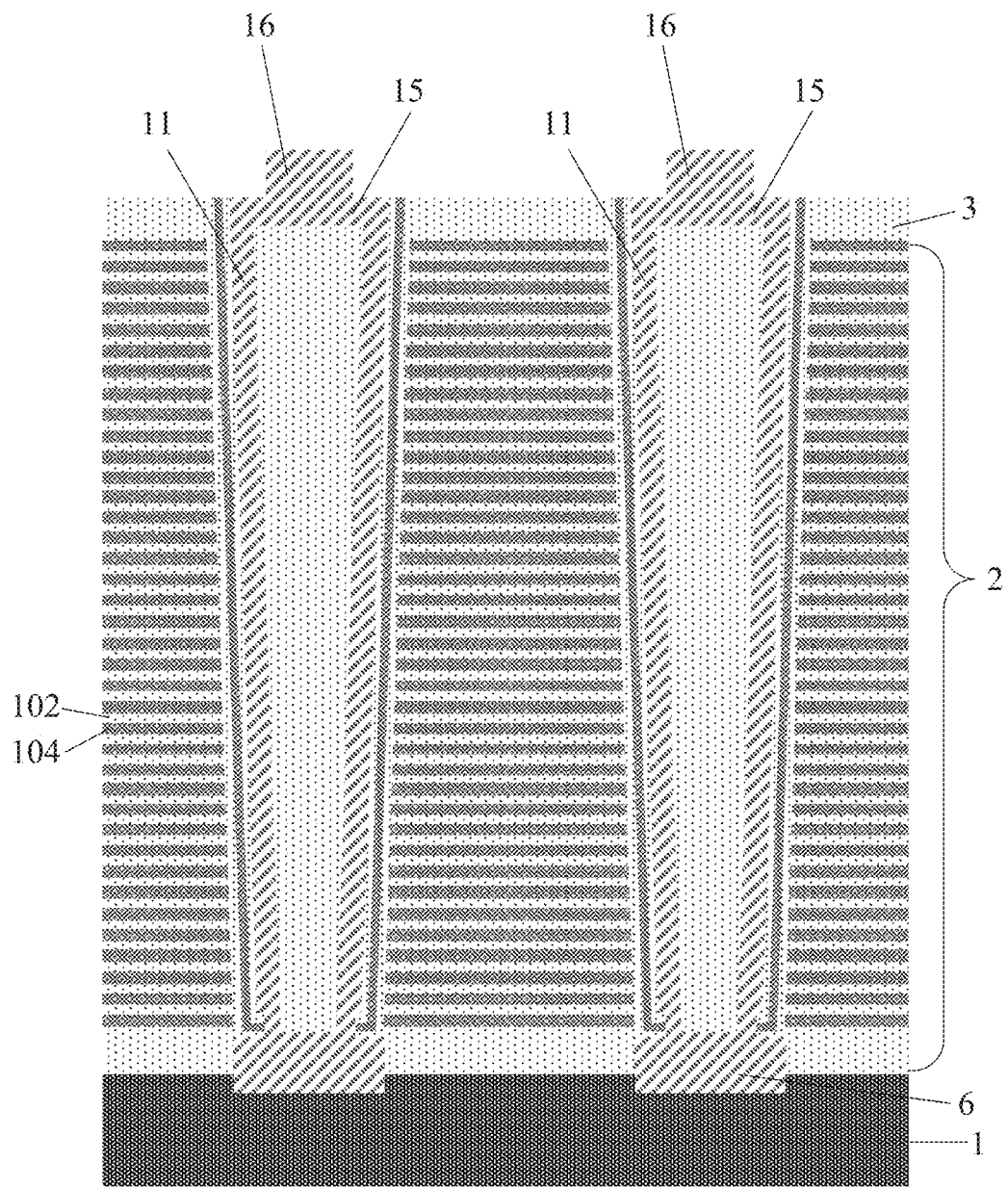

As shown in FIG. 9, a trimming process can be performed to remove an outer part of the exposed portion of each channel column structure 15 to reduce the diameter of the upper portion of the channel column structure 15. For example, a patterning and etching process can be performed to remove an outer part of the exposed portion of each channel column structure 15. The remaining part of the exposed portion of each channel column structure 15 forms a channel plug 16. In some embodiments, the channel plug 16 can be used as a top selective gate channel. Since each channel plug 16 has a reduced diameter comparing to the lower portion of the channel column structure 15, a distance between neighboring channel plugs 16 are increased.

Referring back to FIG. 2, in a next operation S150, a top selective gate structure can be formed on the first insulating layer 3. A fabricating process for forming the top selective gate structure can include the following operations.

Figure 10:
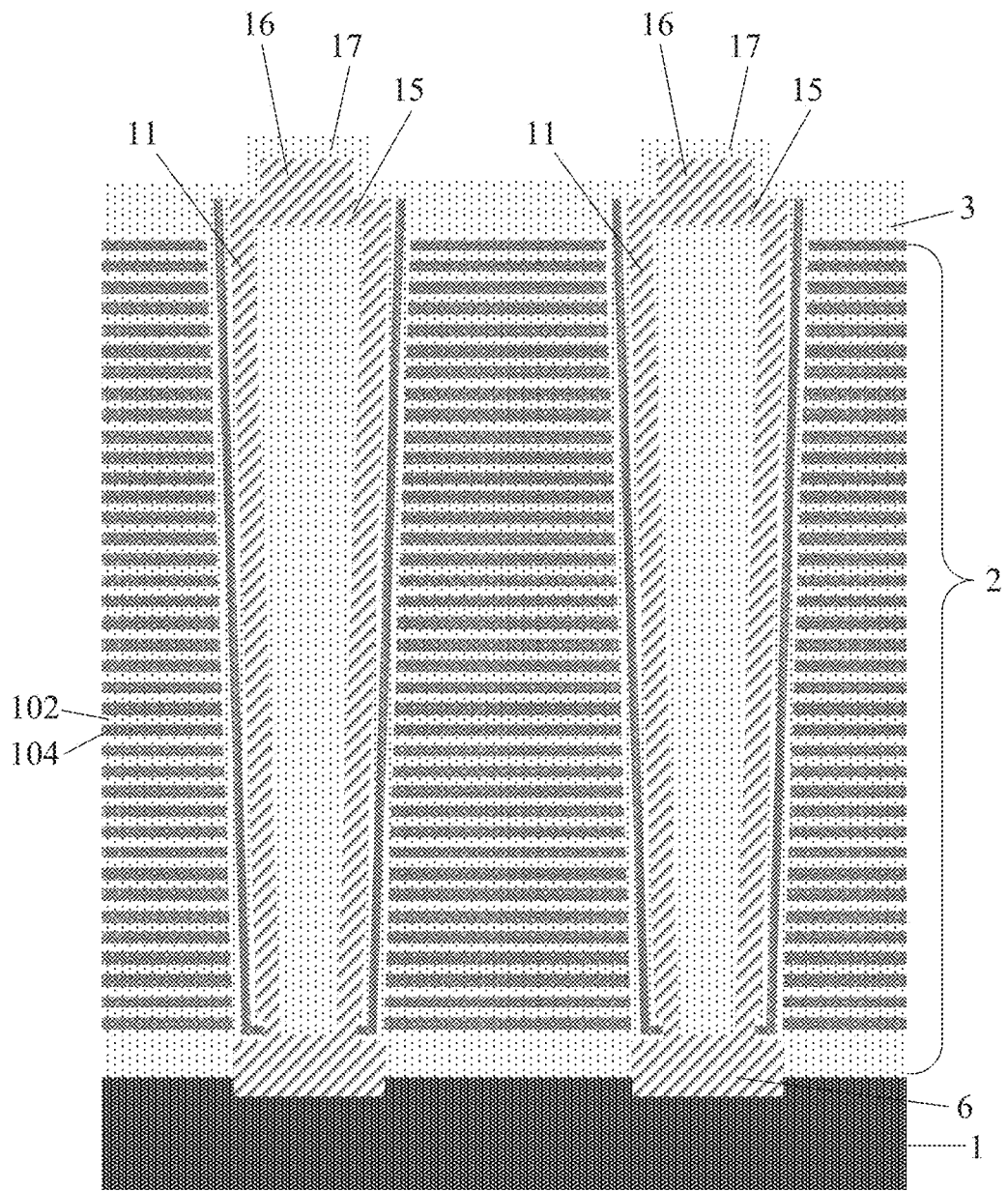

As shown in FIG. 10, a second insulating layer 17 can be formed to completely cover the exposed surfaces of each channel plug 16. In some embodiments, the second insulating layer 17 can be made by any suitable insulating material and/or dielectric material, such as silicon oxide.

Figure 11:
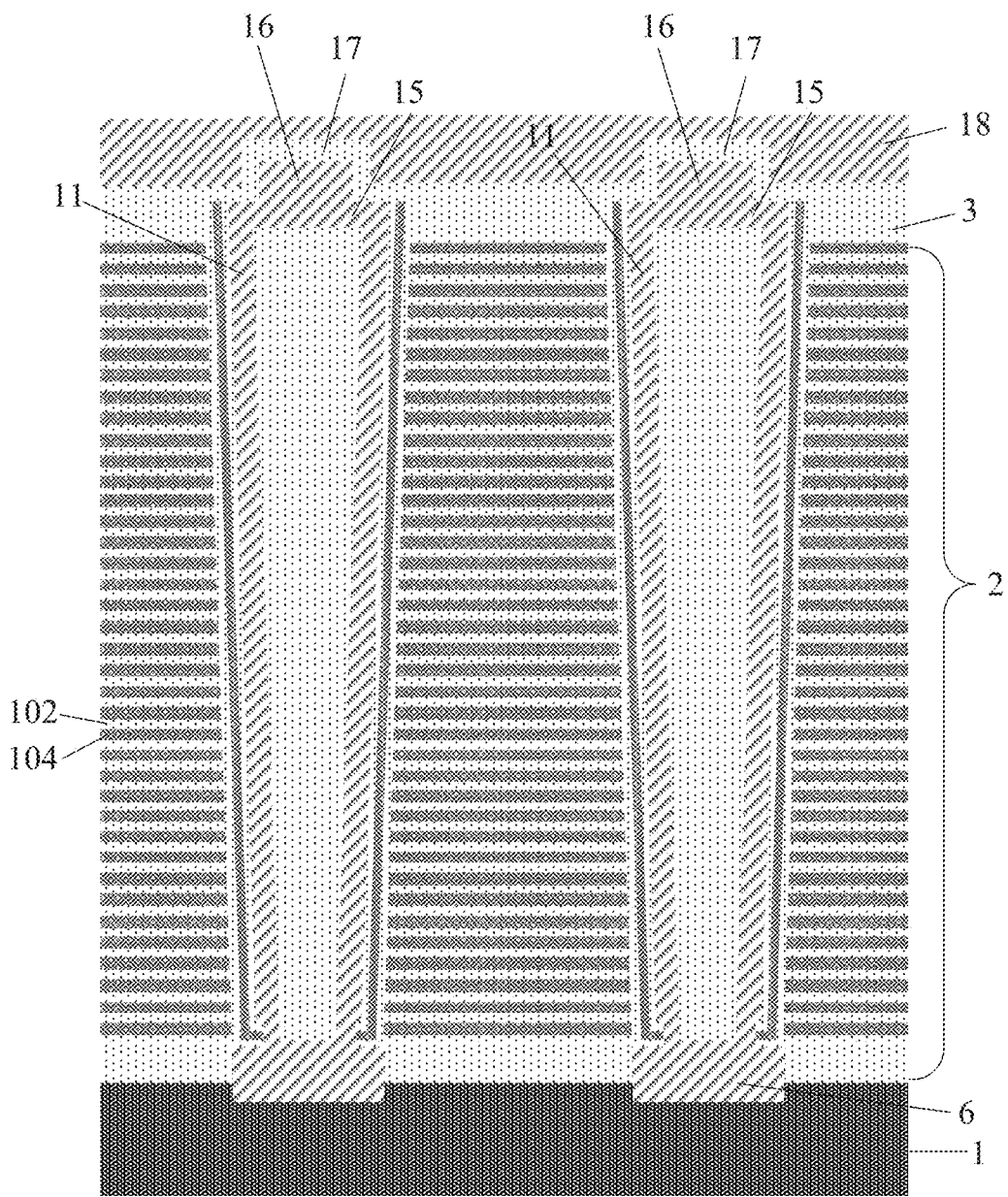
Figure 12:
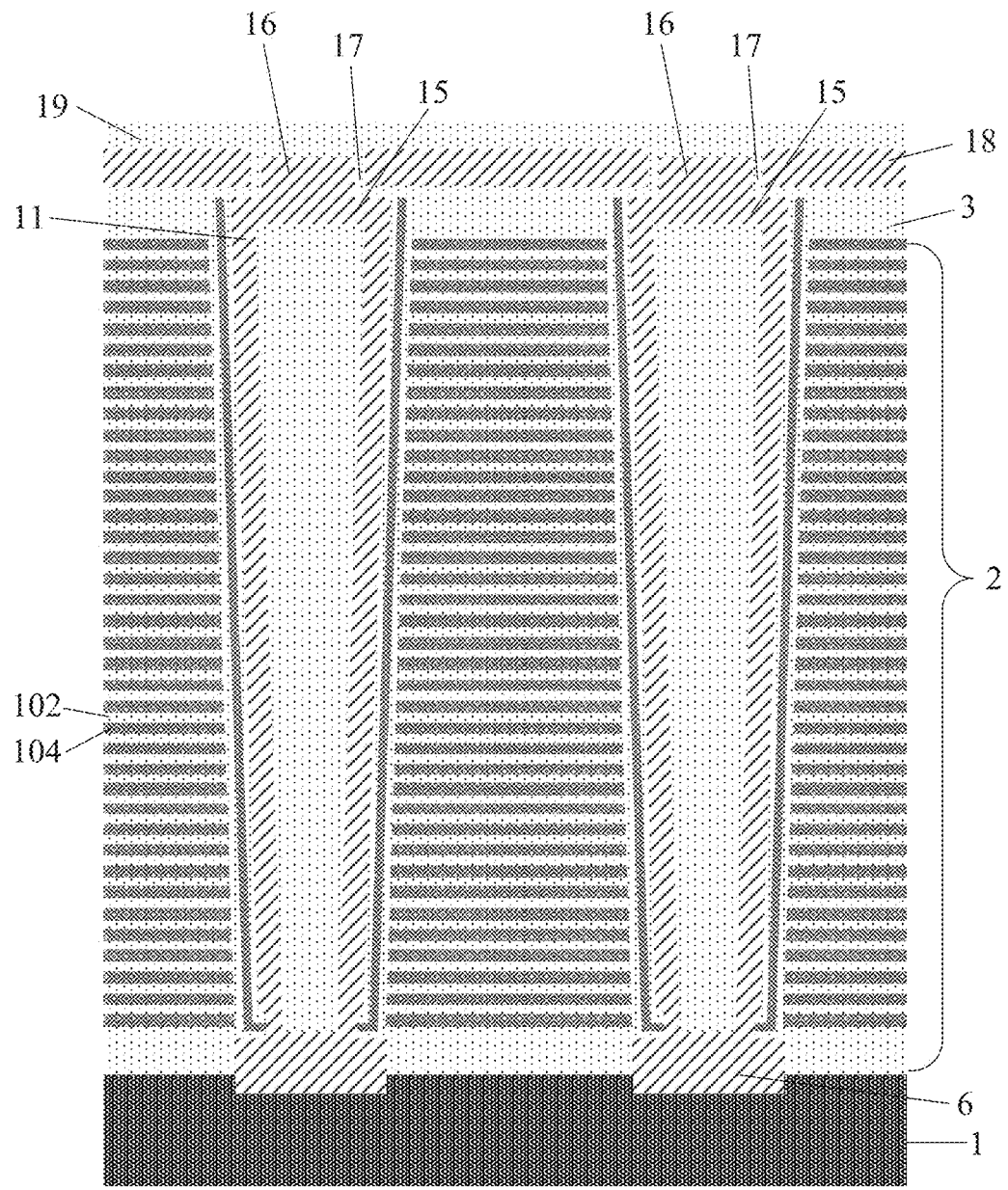

As shown in FIG. 11, a gate electrode layer 18 can be formed on the first insulating layer 3 and the second insulating layer 17. In some embodiments, the gate electrode layer 18 can be an amorphous silicon layer or a polysilicon layer. Each of the second insulating layer 17 and the gate electrode layer 18 can be formed by using a thin film deposition process, such as CVD, PVD, ALD, or any other suitable process. An upper portion of the gate electrode layer can be removed to expose the top surfaces of the second insulating layer 17. In some embodiments, a chemical mechanical polishing (CMP) process can be performed to planarize the top surface of the second insulating layer 17. The remaining portion of the gate electrode layer 18 can form the top selective gate structure. In some embodiments, a thickness of the top selective gate structure 18 can be in a range from about 10 nm to about 100 nm. As shown in FIG. 12, a third insulating layer 19 can be formed on the top selective gate structure 18 and the exposed top surface of the second insulating layer 17.

Figure 15:
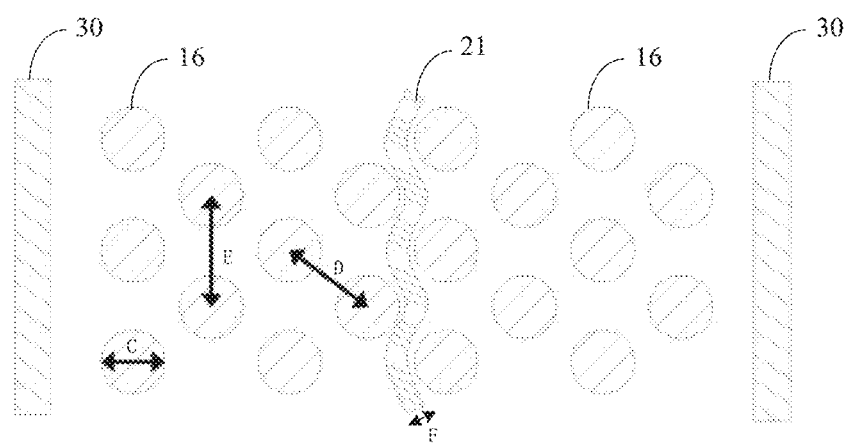
FIG. 15 illustrates a top view of an exemplary 3D memory device in accordance with some embodiments of the present disclosure.

Referring back to FIG. 2, in a next operation S160, a top selective gate cut 20 can be formed between neighboring channel plugs 16. As shown in the top view in FIG. 15, the top selective gate cut 20 can have a wavy shape extending in the horizontal direction. In some embodiments, there are number N rows of channel plugs 16 arranged in a staggered manner between neighboring slits 30, the number N being an even number. The top selective gate cut 20 can be located between the number N/2 row and the number N/2+1 row of channel plugs 16. For example, there are eight rows of channel plugs 16 arranged in a staggered manner between neighboring slits 30, as shown in FIG. 15. The top selective gate cut 20 can be located between the fourth row and fifth row of channel plugs 16, such that the total channel plugs 16 between neighboring slits 30 are separated into two equal groups. In some embodiments, a fabricating process for forming the top selective gate cut 20 can include the following operations.

Figure 13:
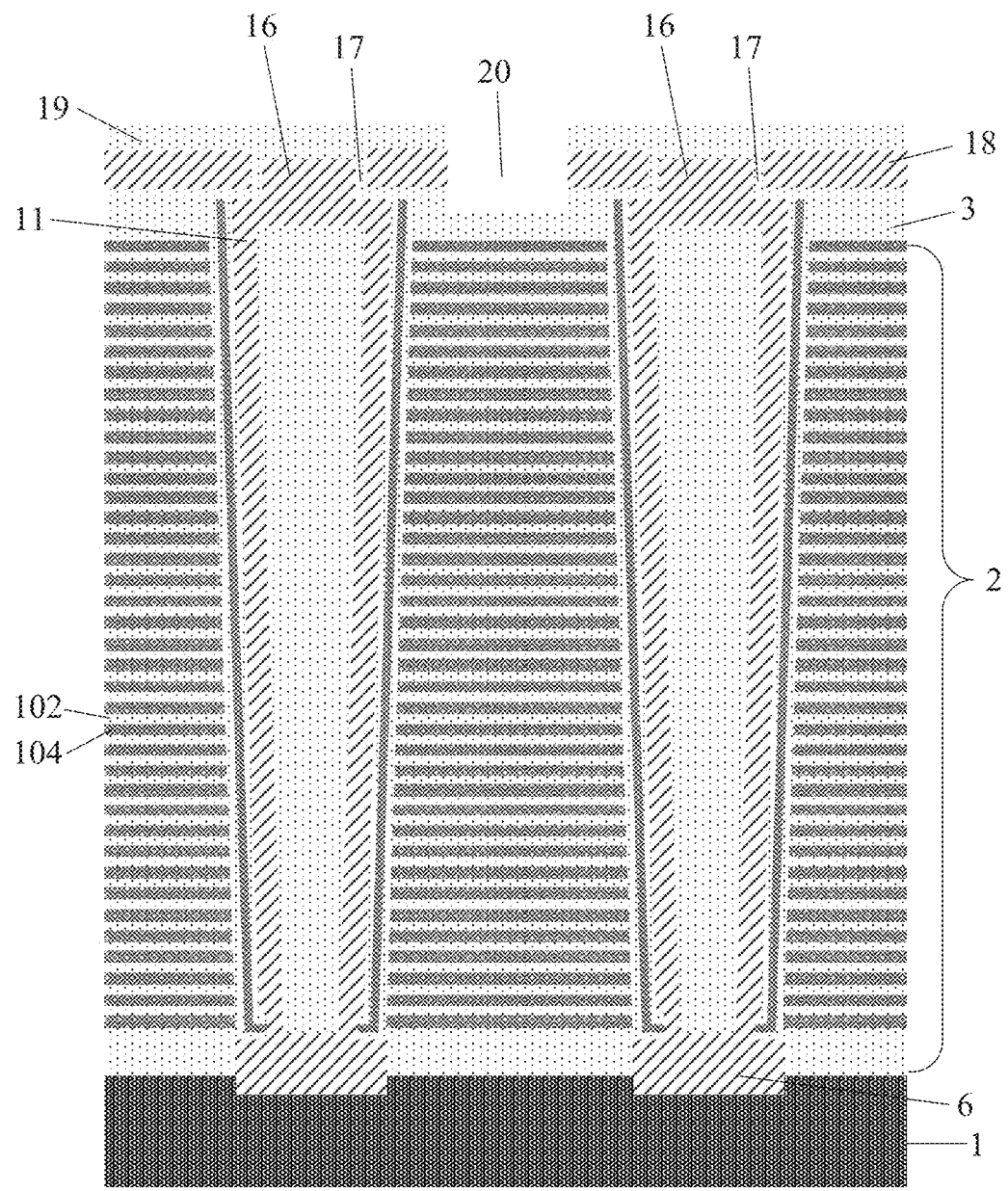
Figure 14:
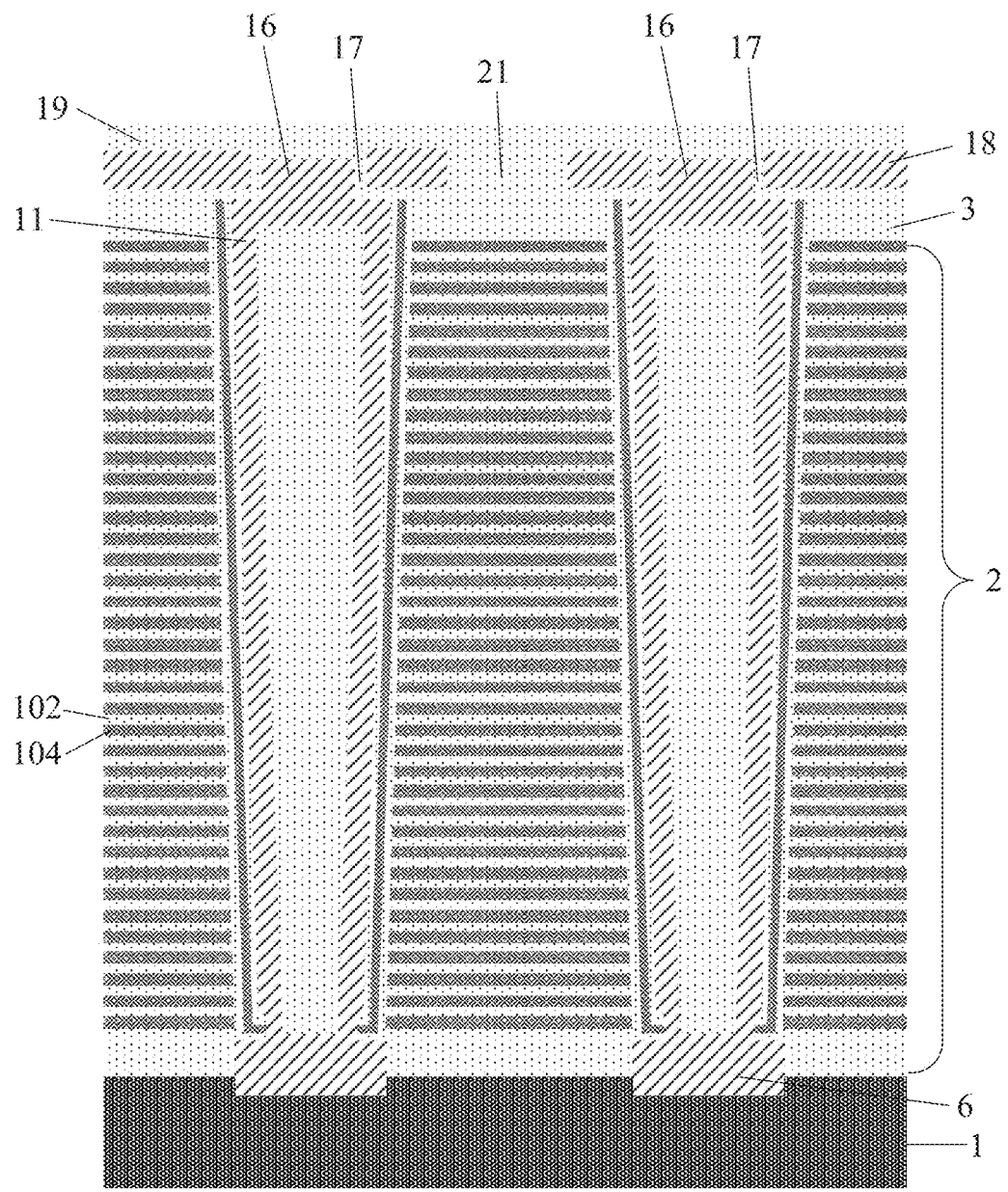

As shown in the cross-sectional view in FIG. 13, a trench 20 can be formed between neighboring channel plugs 16. As described above, the trench 20 has a wavy shape, which is extended in the horizontal direction, and between the fourth row and fifth row of the eight rows of channel plugs 16. In the vertical direction, the trench 20 can penetrate the third insulating layer 19 and the top selective gate structure 18 to expose the first insulating layer 3. As shown in FIG. 14, a dielectric material can be filled into the trench 20 to form the top selective gate cut 21. In some embodiments, a width of the top selective gate cut 21 can be in a range from about 10 nm to about 110 nm.

In some embodiments, the distances between any pair of neighboring channel holes 5 are equal to each other. As a result, the distances between any pair of neighboring channel plugs 16 are also equal to each other. For example, as shown in FIG. 15, the distance E is equal to distance D. In some embodiments, the distances D and E can be in a range from about 100 nm to about 180 nm. The diameter C of the top surface of each channel plug 16 can be in a range from about 50 nm to about 150 nm. That is, the distance between a pair of neighboring channel plugs 16 can be in a range from about 30 nm to about 130 nm. A width of the top surface of the top selective gate cut 21 can be in a range from about 10 nm to about 110 nm. A minimum distance between the top selective gate cut 21 and its adjacent channel plugs 16 can be in a range from about 10 nm to about 60 nm.

In some embodiments, a gate replacement process (also known as the "word line replacement" process) can be performed to replace second dielectric layers 104 (e.g., silicon nitride) of the alternating dielectric stack 2 with conductive layers (e.g., W). As a result, after the gate replacement process, the alternating dielectric stack can become an alternating conductive/dielectric stack. The replacement of second dielectric layers 104 with conductive layers can be performed by wet etching the second dielectric layers 104 (e.g., silicon nitride) selective to the first dielectric layers 102 (e.g., silicon oxide) and filling the structure with conductive layers (e.g., W). Conductive layers can be filled by PVD, CVD, ALD, any other suitable process, or any combination thereof. Conductive layers can include any suitable conductive materials including, but not limited to, W, Co, Cu, Al, polysilicon, silicides, or any combination thereof. Instead of using the top three conductive layers of the alternating conductive/dielectric stack as the top select gates (TSGs), the top selective gate structures 18 that is divided by the top selective gate cut 21 can be used as the TSGs of the memory unit cells.

Accordingly, a method for forming a 3D memory device is disclosed. By trimming the upper portion of the channel column structures, the formed channel plugs can have a reduced size the in lateral direction. That is, the spacing between two adjacent channel plugs can be increased. As such, without occupying the location of a row of channel holes, the top selective gate cut can be arranged between adjacent channel plugs. For example, by using the disclosed method, the arrangement of nine rows of channel holes in a memory finger of the 3D memory device as shown in FIG. 1 can be changed to the arrangement of eight rows of channel holes in a memory finger of the 3D memory device as shown in FIG. 15. By reducing the number of channel holes in each memory finger, an area of each memory finger can be reduced about 8.8%. Therefore, the size requirement of the wafer can be decreased without lowing the storage capacity, which thereby results in a reduced size of the 3D NAND memory device, and a reduced cost.

The method for forming a three-dimensional (3D) memory device can comprises: forming an alternating dielectric stack on a substrate; forming a plurality of channel holes penetrating the alternating dielectric stack; forming a channel structure in each channel hole; forming a channel column structure on the channel structure in each channel hole; trimming an upper portion of each channel column structure to form a channel plug; and forming a top selective gate cut between neighboring channel plugs.

In some embodiments, forming the alternating dielectric stack comprises: forming at least 32 dielectric layer pairs stacked in a vertical direction, wherein each dielectric layer pair includes a first dielectric layer and a second dielectric layer that is different from the first dielectric layer.

In some embodiments, forming the alternating dielectric stack comprises: forming at least 32 dielectric layer pairs stacked in a vertical direction, wherein each dielectric layer pair includes a silicon oxide layer and a silicon nitride layer.

In some embodiments, the method further comprises: forming a first insulating layer on the alternating dielectric stack as the first insulating layer; and forming a hard mask layer on the first insulating layer. The plurality of channel holes can penetrate the first insulating layer and the hard mask layer.

In some embodiments, the method further comprises: before forming the channel structure, forming an epitaxial layer on a surface of the substrate that is exposed by the channel hole.

In some embodiments, forming the channel structure comprises: forming a functional layer on a sidewall of the channel hole; forming a channel layer covering a sidewall of the functional layer, the channel layer being in contact with the epitaxial layer; and forming a filling structure covering a sidewall of the channel layer and filling the channel hole.

In some embodiments, forming the functional layer comprises: forming a barrier layer on the sidewall of the first channel hole to block an outflow of electronic charges; forming a storage layer on a surface of the first barrier layer to store electronic charges during operation of the 3D memory device; and forming a tunneling layer on a surface of the first storage layer to tunnel electronic charges.

In some embodiments, forming the channel column structure comprises: forming a recess in the channel structure to expose an upper portion of the channel layer; forming a channel column structure in the recess; and planarizing a top surface of the channel column structure.

In some embodiments, forming the channel plug comprises: removing the hard mask layer to expose an upper portion of a sidewall of the channel column structure; and trimming the sidewall of the channel column structure to reduce a diameter of the upper portion of the channel column structure in a lateral direction to form the channel plug.

In some embodiments, the method further comprises: after forming the channel plugs, forming a top selective gate structure on the first insulating layer.

In some embodiments, forming the top selective gate structure comprises: forming a second insulating layer to cover exposed surfaces of the channel column structure and the channel plug; forming a gate electrode layer on the first insulating layer and the second insulating layer; removing an upper portion of the gate electrode layer to expose a top surface of the second insulating layer, the remaining portion of the gate electrode layer forming the top selective gate structure; and forming a third insulating layer to cover the top selective gate structure.

In some embodiments, forming the top selective gate cut comprises: forming a trench between neighboring channel plugs, the trench penetrating the third insulating layer and the top selective gate structure to expose the first insulating layer; and depositing a dielectric material in the trench to form the top selective gate cut.

In some embodiments, forming the top selective gate cut comprises: forming the top selective gate cut that has a wavy shape extending along a lateral direction.

In some embodiments, the method further comprises: forming a pair of slits penetrating the alternating dielectric stack, the pair of slits being extended in parallel along the lateral direction; forming a number N of rows of channel holes between the pair of slits, wherein each row of channel holes are arranged staggered with adjacent row of channel holes, and N is an even number; and forming the top selective gate cut between number N/2 row of channel holes and number N/2+1 row of channel holes.

In some embodiments, the method further comprises: forming eight rows of channel holes between the pair of slits; and forming the top selective gate cut between the fourth rows of channel holes and the fifth rows of channel holes.

In some embodiments, the method further comprises: forming the channel plug that has a diameter of a top surface within a range between 50 nm to 150 nm; and forming the top selective gate cut that has a width of a top surface within a range between 10 nm to 110 nm. A minimum distance between the top selective gate cut and an adjacent channel plug is within a range between 10 nm to 60 nm.

In some embodiments, the method further comprises: replacing the second dielectric layers in the alternating dielectric with conductive layers.

Another aspect of the present disclosure provides a 3D memory device formed by the fabricating method described above. The 3D memory device can comprises: an alternating layer stack on a substrate; a plurality of channel holes penetrating the alternating layer stack; a channel structure in each channel hole; a channel column structure on the channel structure in each channel hole, wherein an upper portion of a channel column structure has a first diameter that is less than a second diameter of a lower portion of the channel column structure; and a top selective gate cut between neighboring channel column structure.

In some embodiments, the alternating layer stack comprises: at least 32 conductive/dielectric layer pairs stacked in a vertical direction, wherein each conductive/dielectric pair includes a dielectric layer and a conductive layer.

In some embodiments, the alternating layer stack comprises: at least 32 conductive/dielectric layer pairs stacked in a vertical direction, wherein each conductive/dielectric layer pair includes a silicon oxide layer and a tungsten layer.

In some embodiments, the 3D memory device further comprises: a first insulating layer on the alternating dielectric stack as the first insulating layer. The plurality of channel holes penetrate the first insulating layer and the hard mask layer.

In some embodiments, the channel structure comprises: an epitaxial layer on a bottom of the channel hole; a functional layer on a sidewall of the channel hole; a channel layer covering a sidewall of the functional layer, the channel layer being in contact with the epitaxial layer; and a filling structure covering a sidewall of the channel layer and filling the channel hole.

In some embodiments, the functional layer comprises: a barrier layer on the sidewall of the first channel hole configured to block an outflow of electronic charges; a storage layer on a surface of the first barrier layer configured to store electronic charges during operation of the 3D memory device; and a tunneling layer on a surface of the first storage layer configured to tunnel electronic charges.

In some embodiments, the 3D memory device further comprises: a top selective gate structure on the first insulating layer; a second insulating layer between the top selective gate structure and the channel column structure; and a third insulating layer on a top surface of the top selective gate structure.

In some embodiments, the top selective gate cut penetrates the third insulating layer and the top selective gate structure.

In some embodiments, the top selective gate cut has a wavy shape extending along a lateral direction.

In some embodiments, the 3D memory device further comprises: a pair of slits penetrating the alternating dielectric stack, the pair of slits being extended in parallel along the lateral direction. A number N of rows of channel holes are located between the pair of slits, and N is an even number. Each row of channel holes are arranged staggered with adjacent row of channel holes. The top selective gate cut is located between number N/2 row of channel holes and number N/2+1 row of channel holes.

In some embodiments, the number N is eight.

In some embodiments, a diameter of a top surface of the channel plug is within a range between 50 nm to 150 nm. A width of a top surface of the top selective gate cut is within a range between 10 nm to 110 nm. A minimum distance between the top selective gate cut and an adjacent channel plug is within a range between 10 nm to 60 nm.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
an alternating layer stack on a substrate, wherein the alternating layer stack comprises conductive/dielectric layer pairs stacked in a vertical direction, and wherein each conductive/dielectric layer pair comprises a dielectric layer and a conductive layer;
a first insulating layer on the alternating layer stack, wherein a thickness of the first insulating layer is larger than a thickness of the dielectric layer;
a pair of slits penetrating the alternating layer stack, wherein the pair of slits is extended in a parallel along a first lateral direction;
a plurality of channel holes extending through the alternating layer stack and the first insulating layer;
a channel structure in each channel hole, wherein the channel structure comprises: an epitaxial layer on a bottom of the channel hole, a functional layer on a sidewall of the channel hole, a channel layer covering a sidewall of the functional layer, and a filling structure covering a sidewall of the channel layer and filling the channel hole, and wherein the channel layer comprises a polysilicon layer;

a channel column structure on the channel structure in each channel hole, wherein an upper portion of the channel column structure has a first diameter that is less than a second diameter of a lower portion of the channel column structure;

a top selective gate structure on the first insulating layer, wherein the top selective gate structure is between neighboring channel column structures, wherein the top selective gate structure comprises a polysilicon layer substantially the same as the channel layer, and wherein a thickness of the top selective gate structure is larger than a thickness of the conductive layer;

a second insulating layer between the top selective gate structure and the channel column structure, wherein the second insulating layer comprises an L-type structure, wherein the second insulating layer is disposed on the first insulating layer and wherein the second insulating layer is in contact with a side surface of the channel column structure in the vertical direction;

a third insulating layer on a top surface of the top selective gate structure; and a top selective gate cut extending through the top selective gate structure and the third insulating layer, wherein:

the top selective gate cut extends partially through the first insulating layer, a first surface of the top selective gate cut is parallel to a second surface of the top selective gate cut, a width between the first surface and the second surface is uniform along a second lateral direction perpendicular to the first lateral direction, the top selective gate cut has a wavy shape extending along a second lateral direction perpendicular to the first lateral direction, a number N of rows of channel holes are located between the pair of slits, each row of channel holes are arranged staggered with adjacent row of channel holes, and N is an even number that larger than 2, and the top selective gate cut is located between number N/2 row of channel holes and number N/2+1 row of channel holes.

2. The device of claim 1, wherein the plurality of channel holes extend through the first insulating layer.

3. The device of claim 1, further comprising:
a channel plug in an upper portion of the channel column structure.

4. The device of claim 3, wherein:
a diameter of a top surface of the channel plug is within a range between 50 nm to 150 nm; and
a width of a top surface of the top selective gate cut is within a range between 10 nm to 110 nm.

5. The device of claim 3, wherein:
a minimum distance between the top selective gate cut and an adjacent channel plug is within a range between 10 nm to 60 nm.

6. The device of claim 1, wherein the alternating layer stack comprises:
at least 32 conductive/dielectric layer pairs stacked in a vertical direction, wherein each conductive/dielectric layer pair includes a silicon oxide layer and a tungsten layer.

7. The device of claim 2, further comprising:
a hard mask layer on the first insulating layer;
wherein the plurality of channel holes extend through the hard mask layer.

8. The device of claim 1, wherein the functional layer comprises:
a barrier layer on the sidewall of the channel hole configured to block an outflow of electronic charges;
a storage layer on a surface of the barrier layer configured to store electronic charges during operation of the 3D memory device; and
a tunneling layer on a surface of the storage layer configured to tunnel electronic charges.

9. The device of claim 1, wherein the number N is eight.

* * * * *